United States Patent
Tsai et al.

(10) Patent No.: US 8,490,033 B2
(45) Date of Patent: Jul. 16, 2013

(54) METHOD AND APPARATUS FOR DESIGNING PATTERNING SYSTEM BASED ON PATTERNING FIDELITY

(75) Inventors: Kuen-Yu Tsai, Taipei (TW);
Sheng-Yung Chen, Taipei (TW);
Hoi-Tou Ng, Taipei (TW); Shiau-Yi Ma, Taipei (TW)

(73) Assignee: National Taiwan University, Taipei (TW)

( * ) Notice: Subject to any disclaimer, the term of this patent is extended or adjusted under 35 U.S.C. 154(b) by 2 days.

(21) Appl. No.: 13/478,131

(22) Filed: May 23, 2012

(65) Prior Publication Data

US 2013/0024823 A1    Jan. 24, 2013

(30) Foreign Application Priority Data

Jul. 22, 2011 (TW) .............................. 100126025 A

(51) Int. Cl.
*G06F 17/50* (2006.01)

(52) U.S. Cl.
USPC ............................................................. 716/54

(58) Field of Classification Search
USPC ................................................. 716/100, 54
See application file for complete search history.

(56) References Cited

U.S. PATENT DOCUMENTS

| | | | |
|---|---|---|---|
| 2009/0307649 A1* | 12/2009 | Pramanik et al. | 716/19 |
| 2010/0039633 A1* | 2/2010 | Granik | 355/67 |
| 2012/0040280 A1* | 2/2012 | Agarwal et al. | 430/30 |
| 2012/0117522 A1* | 5/2012 | Feng et al. | 716/54 |

OTHER PUBLICATIONS

Sheng-Yung Chen, et al., "Lithography-patterning-fidelity-aware electron-optical system design optimization", J. Vac. Sci. Technol. B 29, No. 6, Nov./Dec. 2011, p. 06FD04-1-06FD04-8.

Thomson, M. G. R., et al., "Lens and Deflector Design for Microcolumns", Journal of Vacuum Science & Technology B 13, No. 6, Nov./Dec. 1995, p. 2445-2449.

E. Kratschmer, et al., "Experimental evaluation of a 20×20 mm footprint microcolumn", J. Vac. Sci. Technol. B 14, No. 6, Nov./Dec. 1996, p. 3792-3796.

* cited by examiner

*Primary Examiner* — Suchin Parihar
(74) *Attorney, Agent, or Firm* — Jianq Chyun IP Office

(57) ABSTRACT

A method which directly incorporates patterning fidelity into the design of a patterning system is provided. A production result of a target pattern is simulated according to a set of design parameters to obtain a simulated pattern. The target pattern is compared with the simulated pattern to obtain a patterning fidelity, and the values of the set of design parameters of the patterning system are adjusted according to a target patterning fidelity to optimize the values of the set of design parameters of the patterning system.

8 Claims, 3 Drawing Sheets

METHOD AND APPARATUS FOR DESIGNING PATTERNING SYSTEM BASED ON PATTERNING FIDELITY

CROSS-REFERENCE TO RELATED APPLICATION

This application claims the priority benefit of Taiwan application serial no. 100126025, filed on Jul. 22, 2011. The entirety of the above-mentioned patent application is hereby incorporated by reference herein and made a part of this specification.

BACKGROUND OF THE INVENTION

1. Field of the Invention

The invention generally relates to a patterning system, and more particularly, to a method for designing a patterning system.

2. Description of Related Art

In recent years, along with the micronization of semiconductor devices, micro machining techniques for depicting circuit patterns by using charged particle rays (for example, electron beam and ion beam) have been developed in order to break the resolution limit of optical systems.

It has become very difficult to form fine patterns through ultraviolet lithography along with the micronization of semiconductor devices. Thus, manufacturers in the industry have proposed and started to develop resolutions based on lithography techniques using X-rays, electron beams, and ion beams, etc. Previously proposed electron beam printing lithography techniques include a projection exposure with variable axis immersion lenses (PREVAIL), a scattering with angular limitation in projection electron-beam lithography (SCALPEL), and a low energy electron-beam proximity projection lithography (LEEPL).

In the PREVAIL and the SCALPEL techniques, a high-energy electron beam with an acceleration voltage of about 100 kV is passed through part of a mask and projected onto a photoresistor in a quarter of its original size to produce and print a pattern. In the LEEPL technique, a low-energy electron beam with an acceleration voltage of about 2 kV is passed through a cavity formed on a mask to print a pattern on a photoresistor in an equal size. Generally speaking, the higher an electron acceleration voltage is, the less dispersed the electrons in a photoresistor are and accordingly the less chance the electrons have to react with the photoresistor. Thus, a highly sensitive photoresistor has to be adopted in a lithography technique using a high-energy electron beam. Contrarily, because the LEEPL technique adopts a low-energy electron beam, it offers a high photoresistive sensitivity, a high resolution, and a low substrate damage rate.

During a patterning process in a conventional lithography technique, the focusing properties (for example, the size of the focal point, the depth of focus, the distance between an electron-optical system and the focal point, etc.) of the electron beam are usually adjusted according to the specification of the pattern. However, there may be more factors in the formation of a pattern. Thus, the patterning result may not be satisfactory if an electron-optical system is designed by taking only the focusing properties of an electron beam into consideration.

SUMMARY OF THE INVENTION

Accordingly, the invention is directed to a method which directly incorporates patterning fidelity into the design of a patterning system to ensure that the design of the patterning system satisfies the patterning fidelity.

The invention provides a method for designing a patterning system. The method includes following steps. A target pattern, a set of exposure parameters, and a set of design parameters are provided. A first target value range of a target patterning fidelity and a first predetermined value of iteration number of the set of design parameters to adjust the patterning system are provided. A production result of the target pattern is simulated according to the set of design parameters and the set of exposure parameters to obtain a simulated pattern. The simulated pattern is compared with the target pattern to obtain a patterning fidelity. Whether the patterning fidelity is within the first target value range or the iteration number of the set of design parameters is adjusted to reach the first predetermined value is determined. If the patterning fidelity is not within the first target value range or the iteration number of the set of design parameters does not reach the first predetermined value, the values of the set of design parameters of the patterning system are adjusted according to the target patterning fidelity, so as to optimize the values of the set of design parameters of the patterning system.

According to an embodiment of the invention, the patterning fidelity is a quantification result of patterning, wherein the quantification result includes critical dimensions, critical dimension uniformity, line edge roughness, line width roughness or line end shortening, and the target patterning fidelity is defined in the specifications of semiconductors.

According to an embodiment of the invention, a method for obtaining initial values of the set of design parameters includes following steps. A set of initial design parameters is provided. A second target value range of a set of target focusing property parameters and a second predetermined value of iteration number of the set of initial design parameters to adjust the values of the set of initial design parameters are provided. Focusing properties of the patterning system are simulated according to the set of initial design parameters to obtain values of a set of simulated focusing property parameters. Whether the values of the simulated focusing property parameters are within the second target value range or the iteration number of the set of initial design parameters is adjusted to reach the second predetermined value is determined. If the values of the simulated focusing property parameters are not within the second target value range or the iteration number of the set of initial design parameters does not reach the second predetermined value, the values of the set of initial design parameters are adjusted according to the target focusing property parameters. If the values of the set of simulated focusing property parameters are within the second target value range or the iteration number of the set of initial design parameters is adjusted to reach the second predetermined value, the adjusted values of the set of initial design parameters are served as the initial values of the set of design parameters for simulating the production result of the target pattern.

According to an embodiment of the invention, initial values of the set of initial design parameters are obtained by interpolating values heuristically selected according to past experiences.

According to an embodiment of the invention, the simulated focusing property parameters include a simulated focal point size, a simulated depth of focus, and a simulated working distance.

According to an embodiment of the invention, the set of design parameters include at least one or a combination of a thickness of the electrode, a thickness of the focusing lens, a diameter of the electrode, a diameter of the focusing lens, a voltage of the electrode, and a voltage of the focusing lens of the patterning system.

According to an embodiment of the invention, the patterning system is a particle beam direct write patterning system, and the patterning system gradually patterns a substrate of the patterning system at different time points according to the target pattern.

According to an embodiment of the invention, the particle beam includes at least one or a combination of a photon beam, an electron beam, and an ion beam.

As described above, in the invention, a patterning fidelity is obtained by comparing a target pattern with a patterning simulation result, and the values of a set of design parameters are adjusted according to the target patterning fidelity, so that the design of a patterning system can satisfy the patterning fidelity.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
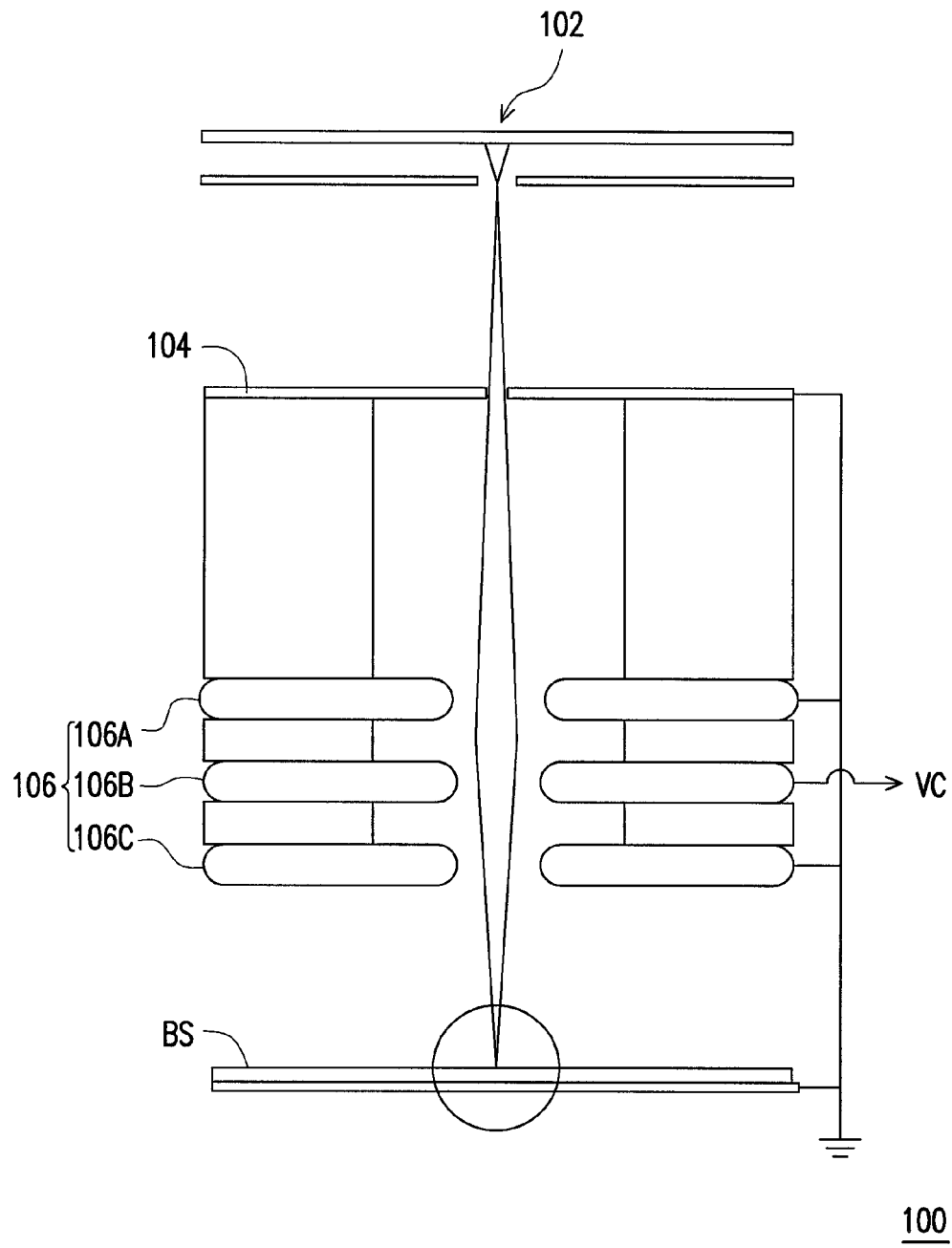
FIG. 1 is a diagram of a patterning system according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a diagram of a patterning system according to an embodiment of the invention. The patterning system 100 is a particle beam direct write patterning system. The patterning system 100 includes a charged particle source 102, a beam-limiting aperture panel 104, and a focusing lens array 106. The charged particle source 102 generates a particle beam. The beam-limiting aperture panel 104 reduces the emission angle of the charged particle source 102, so as to increase the patterning resolution. The focusing lens array 106 controls the focusing properties of the particle beam. In the present embodiment, the focusing lens array 106 includes three electrodes 106A-106C. The electrodes 106A and 106C and the beam-limiting aperture panel 104 are coupled to the ground, and the electrode 106B is coupled to an electrode voltage VC. The focusing properties of the particle beam can be controlled by adjusting the electrode voltage VC. It should be noted that in the present embodiment, the focusing lens array 106 is an Einzel lens. However, the invention is not limited thereto.

Figure 2:
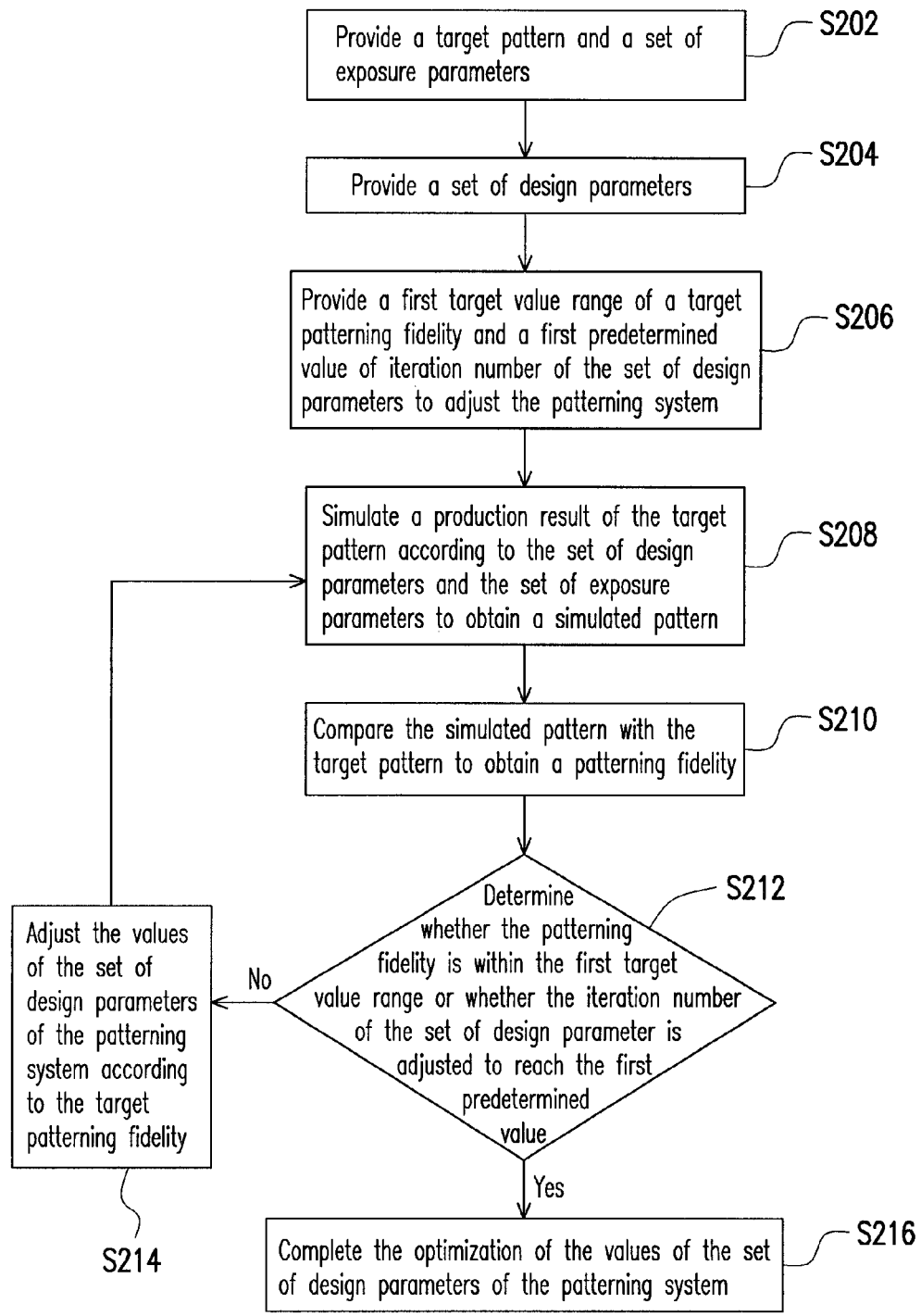
FIG. 2 is a flowchart of a method for designing a patterning system according to an embodiment of the invention.

FIG. 2 is a flowchart of a method for designing a patterning system according to an embodiment of the invention. Below, a method for optimizing a set of design parameters of the patterning system 100 to produce a target pattern on a substrate BS will be described by referring to the patterning system 100 in FIG. 1, wherein the set of design parameters comprise at least one or a combination of a thickness of the electrode, a thickness of the focusing lens, a diameter of the electrode, a diameter of the focusing lens, a voltage of the electrode, and a voltage of the focusing lens of the patterning system. It should be noted that even though the patterning system design method is described in the present embodiment by referring to the patterning system 100 illustrated in FIG. 1, the patterning system 100 illustrated in FIG. 1 is only an exemplary embodiment. In actual applications, the patterning system design method provided by the present embodiment is not limited to the patterning system 100 illustrated in FIG. 1, and aforementioned particle beam is not limited to an electron beam mentioned in the present embodiment. Instead, the particle beam may also be a photon beam, an ion beam, or a combination of electron beam, photon beam, and ion beam.

Referring to both FIG. 1 and FIG. 2, first, a target pattern and a set of exposure parameters are provided (step S202), wherein the set of exposure parameters include a total exposure dosage on the substrate BS, a pixel size and a beam spot size. Then, a set of design parameters is provided (step S204). Next, a first target value range of a target patterning fidelity and a first predetermined value of iteration number of the set of design parameters to adjust the patterning system are provided (step S206), wherein the target patterning fidelity is defined in the specifications of semiconductors. After that, a production result of the target pattern is simulated according to the set of design parameters and the set of exposure parameters to obtain a simulated pattern (step S208). Herein the target pattern is simulated by assuming that the charged particle source 102 is aligned with the focusing lenses, there is no offset between electrodes, the focusing lenses have the same diameter, and the charged particle source 102 and the focusing lenses are a paraxial system.

Thereafter, the simulated pattern is compared with the target pattern (for example, the line width of the simulated pattern is compared with the line width of the target pattern to obtain an error deviation, critical dimensions, a critical dimension uniformity, a line edge roughness, a line width roughness or a line end shortening between the line width of the simulated pattern and the line width of the target pattern) (step S210), so as to obtain a patterning fidelity. After the patterning fidelity is obtained, whether the patterning fidelity is within the first target value range or the iteration number of the set of design parameters is adjust to reach the first predetermined value is determined (step S212). Herein determining whether the patterning fidelity is within the first target value range may be determining whether the error deviation, the critical dimensions, the critical dimension uniformity, the line edge roughness, the line width roughness or the line end shortening between the line width of the simulated pattern and the line width of the target pattern is within a predetermined error range. If the patterning fidelity does not reach a first predetermined value and the iteration number of the set of design parameter does not reach the first predetermined value, the values of the set of design parameters of the patterning system 100 are adjusted according to the target patterning fidelity (step S214), and step S208 is then executed again to perform patterning simulation again according to the adjusted values of the set of design parameters, so as to obtain a new simulated pattern. Steps S208-S214 are repeatedly executed until the patterning fidelity reaches the first predetermined value or the iteration number of the set of design parameter reaches the first predetermined value, so as to complete the optimization of the values of the set of design parameters of the patterning system 100 (step S216). The set of design parameters used for the final simulation is provided for the patterning system 100.

Figure 3:
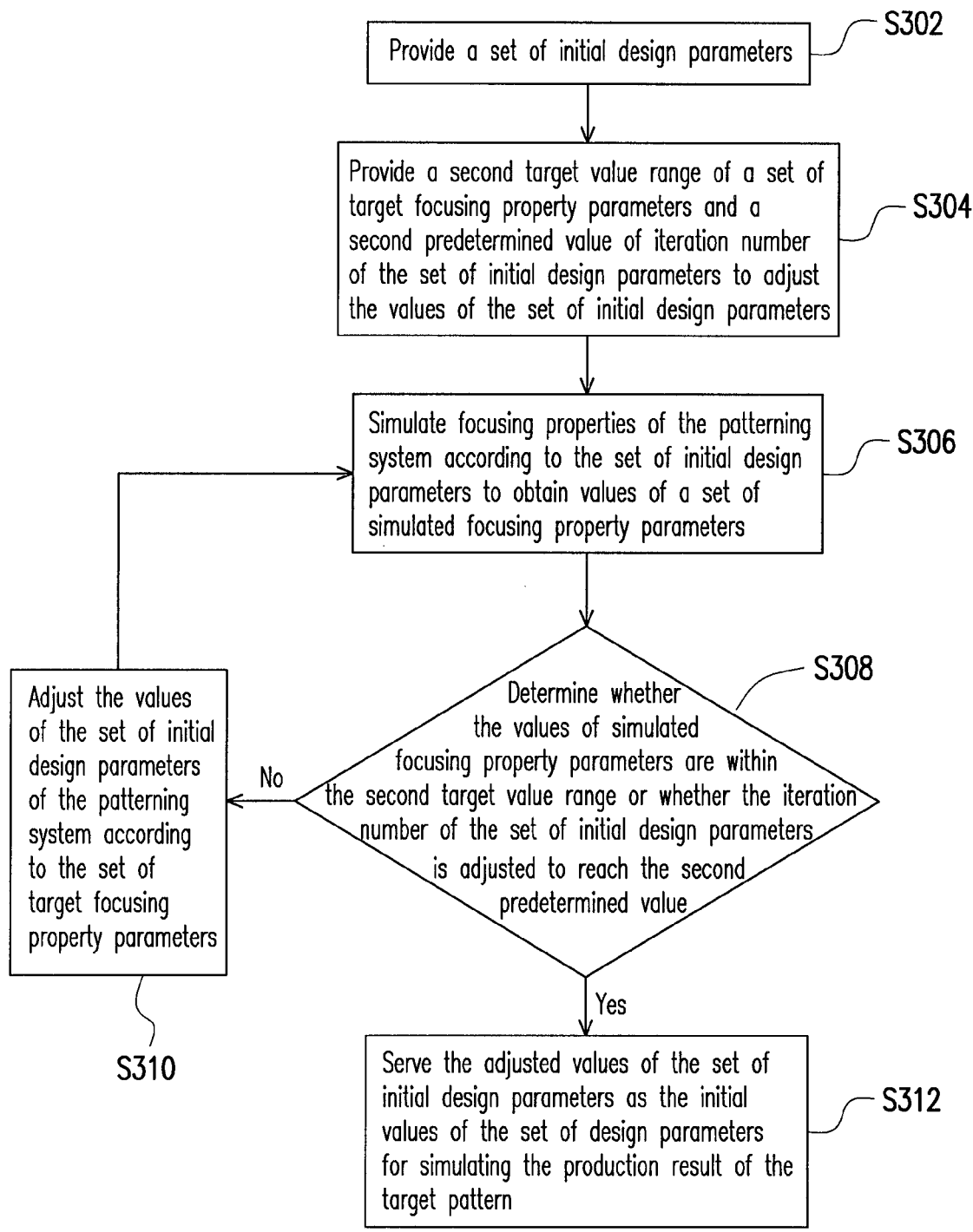
FIG. 3 is a flowchart of a method for obtaining initial values of a set of design parameters according to an embodiment of the invention.

It should be noted that the set of design parameters used for simulating the production result of the target pattern may be obtained by interpolating values heuristically selected according to past experiences or through the method for obtaining initial values of the set of design parameters illustrated in FIG. 3. As shown in FIG. 3, the method for obtaining the initial values of the set of design parameters includes following steps. First, a set of initial design parameters is provided according to the specification of the target pattern (step S302), wherein initial values of the set of initial design parameters are obtained by interpolating values heuristically selected according to past experiences, and the set of initial design parameters may include the thicknesses of the electrodes 106A-106C, the diameters of the focusing lenses in the focusing lens array 106, and the value of the electrode voltage VC in the patterning system 100. Then, a second target value range of a set of focusing property parameters and a second predetermined value of iteration number to adjust the values of the set of initial design parameters are provided (step S304). Next, the focusing properties of the patterning system 100 are simulated according to the set of initial design parameters to obtain values of a set of simulated focusing property parameters (step S306), wherein the simulated focusing property parameters include the size of a simulated focal point, a simulated depth of focus, and a simulated working distance. Herein the simulated working distance refers to the simulated distance between the electrodes 106C and the substrate BS.

Similarly, the simulated focusing property parameters are simulated results obtained by assuming that the charged particle source 102 is aligned with the focusing lenses, there is no offset between the electrodes, the focusing lenses have the same diameter, and the charged particle source 102 and the focusing lenses are a paraxial system. It should be noted that the set of initial design parameters and the simulated focusing property parameters listed above are only exemplary examples but are not intended to limit the scope of the invention.

Thereafter, whether the values of the simulated focusing property parameters are within the second target value range or the iteration number of the set of initial design parameters is adjusted to reach the second predetermined value is determined (step S308). If the values of simulated focusing property parameters are not within the second target value range and the iteration number of the set of initial design parameters does not reach the second predetermined value, the values of the set of initial design parameters of the patterning system 100 are adjusted according to the set of target focusing property parameters (step S310), and step S306 is then executed again to simulate the focusing property parameters of the patterning system 100 according to the adjusted values of the set of initial design parameters, so as to obtain new values of simulated focusing property parameters. If values of the simulated focusing property parameters are within the second target value range or the iteration number of the set of initial design parameters is adjusted to reach the second predetermined value, the adjusted values of the set of initial design parameters are served as the initial values of the set of design parameters for simulating the production result of the target pattern (step S312). Steps S306-S310 are repeatedly executed until the values of the simulated focusing property parameters are within the second target value range or the iteration number of the set of initial design parameters are adjusted to reach the second predetermined value, so as to optimize the simulated focusing property parameters and obtain a set of design parameters for simulating the production result of the target pattern.

As described above, in the invention, a patterning fidelity is obtained by comparing a target pattern with a patterning simulation result, and the values of a set of design parameters are adjusted according to the target patterning fidelity, so that the patterning result can be ensured to satisfy its specification before a system is assembled and tested, and accordingly the fabrication cost of the patterning system can be reduced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method which directly incorporates patterning fidelity into design of a patterning apparatus, comprising:
a target pattern and a set of exposure parameters of the patterning apparatus are received by a computer;
a set of design parameters of the patterning apparatus is received by the computer;
a first target value range of a target patterning fidelity and a first predetermined value of iteration number of the set of design parameters of the patterning apparatus for adjusting the patterning apparatus are received by the computer;
a production result of the target pattern is simulated by the computer according to the set of design parameters of the patterning apparatus and the set of exposure parameters of the patterning apparatus to obtain a simulated pattern;
the target pattern is compared with the simulated pattern by the computer to obtain a patterning fidelity;
whether the patterning fidelity is within the first target value range or the iteration number of the set of design parameters of the patterning apparatus is adjusted to reach the first predetermined value is determined by the computer; and
when the patterning fidelity is not within the first target value range or the iteration number of the set of design parameters of the patterning apparatus does not reach the first predetermined value, the values of the set of design parameters of the patterning apparatus is adjusted by the computer according to the target patterning fidelity, so as to optimize the values of the set of design parameters of the patterning apparatus.

2. The method according to claim 1, wherein the patterning fidelity is a quantification result of patterning, wherein the quantification result includes critical dimensions, critical dimension uniformity, line edge roughness, line width roughness or line end shortening, and the target patterning fidelity is defined in the specifications of semiconductors.

3. The method according to claim 1 further comprising:
a set of initial design parameters of the patterning apparatus is received by the computer;
a second target value range of a set of target focusing property parameters of the patterning apparatus and a second predetermined value of iteration number of the set of initial design parameters of the patterning apparatus to adjust the values of the set of initial design parameters of the patterning apparatus are received by the computer;
focusing properties of the patterning apparatus, is simulated by the computer according to the set of initial design parameters of the patterning apparatus to obtain values of a set of simulated focusing property parameters of the patterning apparatus;

whether the values of the set of simulated focusing property parameters of the patterning apparatus are within the second target value range or the iteration number of the set of initial design parameters of the patterning apparatus is adjusted to reach the second predetermined value is determined by the computer;

when the values of the set of simulated focusing property parameters of the patterning apparatus are not within the second target value range or the iteration number of the set of initial design parameters of the patterning apparatus does not reach the second predetermined value, the values of the set of initial design parameters of the patterning apparatus is adjusted by the computer according to the set of target focusing property parameters of the patterning apparatus; and when the values of the set of simulated focusing property parameters of the patterning apparatus are within the second target value range or the iteration number of the set of initial design parameters of the patterning apparatus is adjusted to reach the second predetermined value, the adjusted values of the set of initial design parameters of the patterning apparatus is served by the computer as the initial values of the set of design parameters of the patterning apparatus for simulating the production result of the target pattern by the computer.

4. The method according to claim 3, wherein initial values of the set of initial design parameters of the patterning apparatus are obtained by interpolating values heuristically selected according to past experiences.

5. The method according to claim 4, wherein the simulated focusing property parameters of the patterning apparatus comprise a simulated focal point size, a simulated depth of focus, and a simulated working distance.

6. The method according to claim 1, wherein the set of design parameters of the patterning apparatus comprise at least one or a combination of a thickness of the electrode, a thickness of the focusing lens, a diameter of the electrode, a diameter of the focusing lens, a voltage of the electrode, and a voltage of the focusing lens of the patterning apparatus.

7. The method according to claim 1, wherein the patterning apparatus, is a particle beam direct write patterning apparatus, and the patterning apparatus, gradually patterns a substrate of the patterning apparatus, at different time points according to the target pattern.

8. The method according to claim 7, wherein the particle beam comprises at least one or a combination of a photon beam, an electron beam, and an ion beam.

* * * * *